(12) United States Patent
Moon et al.

(10) Patent No.: US 11,222,959 B1
(45) Date of Patent: Jan. 11, 2022

(54) METAL OXIDE SEMICONDUCTOR FIELD EFFECT TRANSISTOR AND METHOD OF MANUFACTURING SAME

(71) Applicant: HRL LABORATORIES LLC, Malibu, CA (US)

(72) Inventors: Jeong-Sun Moon, Moorpark, CA (US); Hwa Chang Seo, Torance, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/160,930

(22) Filed: May 20, 2016

(51) Int. Cl.
| | |
|---|---|
| *H01L 21/336* | (2006.01) |
| *H01L 29/78* | (2006.01) |
| *H01L 29/786* | (2006.01) |
| *H01L 29/66* | (2006.01) |
| *H01L 29/49* | (2006.01) |
| *H01L 29/51* | (2006.01) |
| *H01L 21/02* | (2006.01) |
| *H01L 29/16* | (2006.01) |

(52) U.S. Cl.
CPC .... *H01L 29/66045* (2013.01); *H01L 21/0228* (2013.01); *H01L 21/0234* (2013.01); *H01L 21/02164* (2013.01); *H01L 21/02181* (2013.01); *H01L 21/02359* (2013.01); *H01L 29/1606* (2013.01); *H01L 29/4908* (2013.01); *H01L 29/517* (2013.01); *H01L 29/66015* (2013.01); *H01L 29/78684* (2013.01); *H01L 2924/13088* (2013.01)

(58) Field of Classification Search
CPC ........... H01L 29/1606; H01L 29/66015; H01L 29/66045; H01L 29/517; H01L 29/4908; H01L 21/02164; H01L 21/02181; H01L 21/0228; H01L 21/0234; H01L 21/02359; H01L 29/78684; H01L 2924/13088
See application file for complete search history.

(56) References Cited

U.S. PATENT DOCUMENTS

| | | | |
|---|---|---|---|
| 7,364,940 B2 * | 4/2008 | Kim | H01L 51/0529 438/99 |
| 8,101,474 B2 * | 1/2012 | Zhu | H01L 21/28255 257/216 |

(Continued)

FOREIGN PATENT DOCUMENTS

| | | | | |
|---|---|---|---|---|
| CN | 102623310 | * | 8/2012 | ............. H01L 21/04 |
| CN | 107482109 | * | 12/2017 | ............. H01L 35/14 |
| KR | 2011078180 | * | 7/2011 | ........... H01L 21/336 |

OTHER PUBLICATIONS

Moon et al., Epitaxial-Graphene RF Field-Effect Transistors on Si-Face 6H-SiC Substrates, IEEE Electron Device Letters, vol. 30, No. 6, Jun. 2009, pp. 650-652. (Year: 2009).*

(Continued)

*Primary Examiner* — Mary A Wilczewski
(74) *Attorney, Agent, or Firm* — Lewis Roca Rothgerber Christie, LLP

(57) ABSTRACT

A Field Effect Transistor (FET) device and a method for manufacturing it are disclosed. The FET device contains a graphene layer, a composite gate dielectric layer disposed above the graphene layer, wherein the composite gate layer is passivated with fluorine, and a metal gate disposed above the composite gate dielectric layer. The method disclosed teaches how to manufacture the FET device.

15 Claims, 8 Drawing Sheets

(56) References Cited

U.S. PATENT DOCUMENTS

| | | | | |
|---|---|---|---|---|
| 8,247,806 B2* | 8/2012 | Chae | H01L 29/0673 | 257/40 |
| 8,530,886 B2* | 9/2013 | Avouris | H01L 29/518 | 257/29 |
| 8,673,703 B2* | 3/2014 | Lin | H01L 29/1606 | 438/164 |
| 8,680,511 B2* | 3/2014 | Dimitrakopoulos | H01L 29/4908 | 257/24 |
| 8,994,079 B2* | 3/2015 | Song | H01L 29/1606 | 257/288 |
| 9,064,964 B2* | 6/2015 | Moon | H01L 29/78684 | |
| 9,362,379 B2* | 6/2016 | Moon | H01L 29/78684 | |
| 9,679,970 B1* | 6/2017 | Son | H01L 29/1606 | |
| 9,704,964 B1* | 7/2017 | Ordonez | H01L 29/45 | |
| 9,880,148 B1* | 1/2018 | Son | A61N 1/36125 | |
| 10,181,516 B2* | 1/2019 | Colombo | H01L 29/1606 | |
| 2009/0020764 A1* | 1/2009 | Anderson | H01L 29/1606 | 257/77 |
| 2009/0140801 A1* | 6/2009 | Ozyilmaz | B82Y 10/00 | 327/581 |
| 2009/0181502 A1* | 7/2009 | Parikh | H01L 29/1606 | 438/164 |
| 2011/0017979 A1* | 1/2011 | Meric | H01L 29/1606 | 257/29 |
| 2011/0068320 A1* | 3/2011 | Marinero | B82Y 10/00 | 257/9 |
| 2011/0108802 A1* | 5/2011 | Lin | B82Y 10/00 | 257/24 |
| 2011/0114918 A1* | 5/2011 | Lin | H01L 29/1606 | 257/24 |
| 2011/0163289 A1* | 7/2011 | Zhu | H01L 21/28255 | 257/9 |
| 2011/0227043 A1* | 9/2011 | Guo | H01L 29/42384 | 257/24 |
| 2011/0291068 A1* | 12/2011 | Kobayashi | H01L 29/66742 | 257/9 |
| 2012/0007054 A1* | 1/2012 | Chang | B82Y 10/00 | 257/29 |
| 2012/0049160 A1* | 3/2012 | Sano | H01L 21/8213 | 257/27 |
| 2012/0049161 A1* | 3/2012 | Dimitrakopoulos | H01L 21/02378 | 257/29 |
| 2012/0056161 A1* | 3/2012 | Avouris | H01L 29/1606 | 257/24 |
| 2012/0074387 A1* | 3/2012 | King | H01L 21/02581 | 257/29 |
| 2012/0080658 A1* | 4/2012 | Yang | B82Y 10/00 | 257/9 |
| 2012/0115295 A1* | 5/2012 | Lin | H01L 29/1606 | 438/268 |
| 2012/0168722 A1* | 7/2012 | Chung | H01L 29/1606 | 257/29 |
| 2012/0168723 A1* | 7/2012 | Park | H01L 21/0237 | 257/29 |
| 2012/0168724 A1* | 7/2012 | Park | H01L 21/8258 | 257/29 |
| 2012/0175594 A1* | 7/2012 | Chen | H01L 29/4908 | 257/29 |
| 2012/0181505 A1* | 7/2012 | Lin | H01L 29/78684 | 257/29 |
| 2012/0181506 A1* | 7/2012 | Farmer | H01L 29/1606 | 257/29 |
| 2012/0199815 A1* | 8/2012 | Kondo | H01L 21/02381 | 257/29 |
| 2012/0211723 A1* | 8/2012 | Dimitrakopoulos | H01L 21/02378 | 257/9 |
| 2012/0235118 A1* | 9/2012 | Avouris | H01L 29/518 | 257/27 |
| 2012/0258587 A1* | 10/2012 | Kub | H01L 29/78684 | 438/610 |
| 2012/0276718 A1* | 11/2012 | Cheng | H01L 29/1606 | 438/478 |
| 2012/0305891 A1* | 12/2012 | Nayfeh | H01L 29/1606 | 257/26 |
| 2012/0313079 A1* | 12/2012 | Song | H01L 29/1606 | 257/29 |
| 2012/0326126 A1* | 12/2012 | Chen | H01L 29/42384 | 257/29 |
| 2013/0105765 A1* | 5/2013 | Haensch | H01L 29/42364 | 257/29 |
| 2013/0113081 A1* | 5/2013 | Chen | B82Y 10/00 | 257/602 |
| 2013/0137248 A1* | 5/2013 | Afzali-Ardakani | H01L 29/778 | 438/510 |
| 2013/0143374 A1* | 6/2013 | Hayashi | H01L 29/41725 | 438/197 |
| 2013/0207080 A1* | 8/2013 | Dimitrakopoulos | H01L 29/4908 | 257/24 |
| 2013/0234762 A1* | 9/2013 | Han | H01L 29/42364 | 327/109 |
| 2013/0285061 A1* | 10/2013 | Shukla | H01L 51/052 | 257/57 |
| 2013/0285138 A1* | 10/2013 | Vega | H01L 29/7391 | 257/330 |
| 2014/0001440 A1* | 1/2014 | Bojarczuk | H01L 29/517 | 257/27 |
| 2014/0017883 A1* | 1/2014 | Dal | H01L 21/02378 | 438/478 |
| 2014/0021446 A1* | 1/2014 | Lee | H01L 29/78684 | 257/29 |
| 2014/0034899 A1* | 2/2014 | Ahn | H01L 29/06 | 257/9 |
| 2014/0239256 A1* | 8/2014 | Kim | H01L 21/0262 | 257/29 |
| 2014/0239257 A1* | 8/2014 | Moon | H01L 29/78684 | 257/29 |
| 2014/0264282 A1* | 9/2014 | Lee | H01L 29/267 | 257/29 |
| 2014/0264507 A1* | 9/2014 | Lee | H01L 29/778 | 257/292 |
| 2014/0299841 A1* | 10/2014 | Nourbakhsh | H01L 29/775 | 257/29 |
| 2014/0312412 A1* | 10/2014 | Guo | H01L 29/41775 | 257/330 |
| 2014/0353590 A1* | 12/2014 | Cao | H01L 29/66742 | 257/29 |
| 2015/0194536 A1* | 7/2015 | Chen | H01L 29/4908 | 257/29 |
| 2015/0214324 A1* | 7/2015 | Moon | H01L 29/78684 | 438/164 |
| 2015/0280011 A1* | 10/2015 | Cho | H01L 29/78606 | 257/29 |
| 2015/0280012 A1* | 10/2015 | Sato | H01L 29/78684 | 257/29 |
| 2015/0303871 A1* | 10/2015 | Jenkins | H03B 7/06 | 331/117 FE |
| 2016/0005609 A1* | 1/2016 | Di | H01L 29/42364 | 438/17 |
| 2016/0005881 A1* | 1/2016 | Fujii | H01L 51/0045 | 257/24 |
| 2016/0027928 A1* | 1/2016 | Sato | H01L 29/78603 | 257/29 |
| 2016/0049475 A1* | 2/2016 | Bol | H01L 29/1606 | 257/29 |
| 2016/0056240 A1* | 2/2016 | Yamaguchi | H01L 29/66742 | 257/29 |
| 2016/0104852 A1* | 4/2016 | Sato | H01L 29/42312 | 257/27 |
| 2016/0111180 A1* | 4/2016 | Joo | H01B 1/04 | 428/408 |
| 2017/0077235 A1* | 3/2017 | Caudillo | H01L 29/66984 | |
| 2017/0133468 A1* | 5/2017 | Colombo | H01L 29/401 | |

(56) References Cited

U.S. PATENT DOCUMENTS

| | | | |
|---|---|---|---|
| 2017/0162654 A1* | 6/2017 | Maeda | H01L 29/04 |
| 2017/0338311 A1* | 11/2017 | Lee | H01L 29/1606 |
| 2017/0345944 A1* | 11/2017 | Lin | H01L 29/778 |
| 2017/0346010 A1* | 11/2017 | Chen | H01L 51/0013 |
| 2018/0130897 A1* | 5/2018 | Friedman | H01L 29/66984 |
| 2018/0158904 A1* | 6/2018 | Zhao | H01L 29/0649 |
| 2018/0158905 A1* | 6/2018 | Zhao | H01L 29/0649 |
| 2018/0158921 A1* | 6/2018 | Huo | H01L 51/0529 |
| 2018/0158960 A1* | 6/2018 | Huo | H01L 21/02521 |
| 2018/0308696 A1* | 10/2018 | Colombo | H01L 21/043 |
| 2019/0273166 A1* | 9/2019 | Venugopal | H01L 29/78618 |

OTHER PUBLICATIONS

Garces et al., Graphene functionalization and seeding for dielectric deposition and device integration, J. Vac. Sci. Technol. B 30(3), May/Jun. 2012, pp. 030801-1 to 030801-21. (Year: 2012).*

Fitzer et al., Recommended Terminilogy for the Description of Carbon as a Solid, Pure & Appl. Chem., vol. 67, No. 3, pp. 473-506, 1995. (Year: 1995).*

Scientific Background on the Nobel Prize in Physics 2010, Graphene, The Swedish Academy of Sciences, pp. 1-10, Oct. 5, 2010 (Year: 2010).*

Geim et al., The rise of graphene, Nature Materials, vol. 6, Mar. 2007, pp. 183-191. (Year: 2007).*

Moon et al., Ultra-low resistance ohmic contacts in graphene fireld effect transistors, Appl. Phys. Lett. 100, pp. 203512-1 to 203512-3,2012. (Year: 2012).*

Gahoi et al., Systematic Comparison of Metal Contacts on CVD Graphene, Published in 2015 45th European Solid State Device Research Conference , Sep. 14-18, 2015 (Downloaded on May 5, 2020 at 21:43:28 UTC from IEEE Xplore.). (Year: 2015).*

Robinson et al., Contacting Graphene, Appl. Phys. Lett. 98, pp. 053103-1 to 053103-3, 2011. (Year: 2011).*

Yen-Ting Chen et al., Effects of fluorine incorporation into $HfO_2$ gate dielectrics on InP and $In_{0.53}Ga_{0.47}As$ metal-oxide-semiconductor field-effect-transistors, Applied Physics Letters, Jun. 23, 2010, pp. 253502 to 253502-3, vol. 96, AIP Publishing, American Institute of Physics.

Babak Fallahazad et al., Dielectric thickness dependence of carrier mobility in graphene with $HfO_2$ top dielectric, Applied Physics Letters, Sep. 23, 2010, pp. 123105 to 123105-3, vol. 97, AIP Publishing, American Institute of Physics.

Nelson Y. Garces et al., Graphene functionalization and seeding for dielectric deposition and device integration, Mar. 19, 2012, pp. 030801 to 030801-21, vol. 30, Journal of Vacuum Science & Technology B, American Vacuum Society.

J.S. Moon et al., Epitaxial-Graphene RF Field-Effect Transistors on Si-Face 6H-SiC Substrates, IEEE Electron Device Letters, Jun. 2009, pp. 650 to 652, vol. 30, No. 6, IEEE.

Woei-Cherng Wu et al., Fluorinated $HfO_2$ Gate Dielectrics Engineering for CMOS by pre-and post-$CF_4$ Plasma Passivation, 2008 IEEE International Electron Devices Meeting, 2008, 4 pages, IEEE.

Ruilong Xie et al., High-k gate stack on germanium substrate with fluorine incorporation, Applied Physics Letters, Apr. 22, 2008, pp. 163505 to 163505-3, vol. 92, AIP Publishing, American Institute of Physics.

* cited by examiner

FIG. 2b

METAL OXIDE SEMICONDUCTOR FIELD EFFECT TRANSISTOR AND METHOD OF MANUFACTURING SAME

FIELD

The present invention relates to Metal Oxide Semiconductor Field Effect Transistor (MOSFET). More particularly, the present invention relates to a graphene MOSFET and method of manufacturing same.

BACKGROUND

As known in the art, high dielectric constant (K) gate dielectrics have been used as a gate dielectric for graphene based MOSFETs as described in more detail by J. S. Moon et al., in "Epitaxial Graphene RF Field-Effect Transistors on Si-face 6H-SiC Substrates", IEEE Electron Dev. Lett., vol. 30, pp. 650-652, 2009, which is incorporated herein by reference in its entirety. The epitaxial material quality of the graphene based MOSFETs is comparable to state-of-the-art lattice-matched InP with sheet resistance of ~200 ohm/sq and its variation down to ~3% on 100 mm wafers.

The ohmic contacts of the graphene based MOSFETs known in the art provide contact resistance ~0.03 Ω·mm, resulting in a lowest on-state resistance of 0.13 Ω·mm and a highest saturated source-drain current of ~3 A/mm at Vds=1 V. Various approaches have been proposed to make the Atomic-Layer Deposition (ALD) grown high-K films stick to graphene channel without pinholes. Various seedling layers have been proposed and described by B. Fallahazad et al., in "Thickness dependence of carrier mobility in mono and bilayer graphene with HfO2 gate dielectric" Device Research Conference, p. 81, 2010, which is incorporated herein by reference in its entirety. Various seedling layers have also been proposed and described by N. Y. Garces et al., in "Graphene functionalization and seeding for dielectric deposition and device integration", JVST B. vol 30, p. 030801, 2012, which is incorporated herein by reference in its entirety. These various functionalization layers are done by chemical processes with chemical bonds, which may not be compatible with semiconductor fabrication flow.

Presently disclosed embodiments disclose devices and/or methods for improving performance of the graphene based MOSFETs.

SUMMARY OF THE INVENTION

According to some embodiments, a field-effect transistor is presently disclosed. The field-effect transistor comprises a graphene layer, a composite gate dielectric layer disposed above the graphene layer, wherein the composite gate layer is passivated with fluorine, and a metal gate disposed above the composite gate dielectric layer.

According to some embodiments, a method is presently disclosed. The method comprises forming a graphene layer, forming a graphene mesa in the graphene layer, and forming a composite gate dielectric layer above the graphene mesa.

BRIEF DESCRIPTION OF THE FIGURES

FIG. 2b depicts Scanning Electron Microscope image of $HfO_2$ material according to some embodiments presently disclosed.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In some embodiments presently disclosed, a graphene MOSFETs according to the present disclosure comprises a composite gate dielectric layer such as, for example, SiO2/HfO2. In some embodiments presently disclosed, a fluorine is implemented to passivate, for example, a stack of $SiO_2$/$HfO_2$ gate dielectric films using, for example, high-pressure and low-damage $CF_4$ plasma treatment. According to some embodiments, the fluorine may bond with broken bonds within $HFO_2$ grown by atomic layer deposition (ALD). In some embodiments presently disclosed incorporation of fluorine reduces the hysteresis and improves gm in the graphene MOSFETs.

According to one aspect, a field-effect transistor is presently disclosed. The field-effect transistor comprises a graphene layer, a composite gate dielectric layer disposed above the graphene layer, wherein the composite gate layer is passivated with fluorine, and a metal gate disposed above the composite gate dielectric layer.

According to another aspect, a method is presently disclosed. The method comprises forming a graphene layer, forming a graphene mesa in the graphene layer, and forming a composite gate dielectric layer above the graphene mesa.

Figure 1:
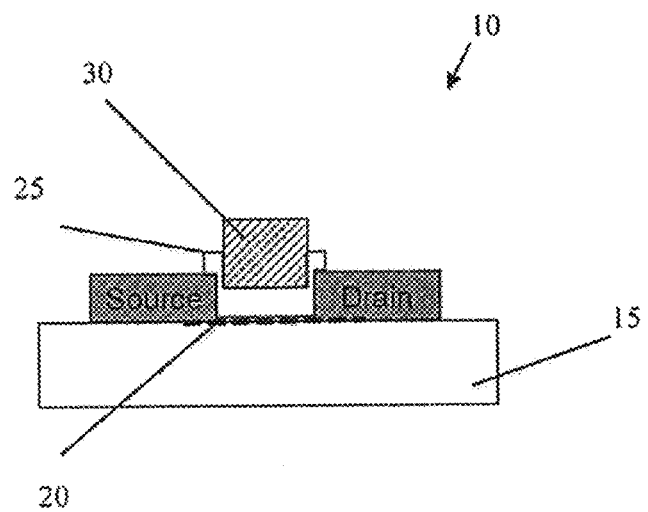
FIG. 1 depicts a MOSFET according to some embodiments presently disclosed.

Referring to FIG. 1, a MOSFET 10 is shown according to some embodiments presently disclosed. In some embodiments presently disclosed, the MOSFET 10 comprises a substrate 15, a graphene layer 20 disposed above the substrate 15, a composite gate dielectric layer 25 disposed above the graphene layer 20, and a metal gate 30 disposed above the graphene layer 20. In some embodiments, the composite gate dielectric layer 25 comprises, for example, a stack of $SiO_2$ and $HfO_2$. In some embodiments, the $HfO_2$ is deposited using Atomic Layer Deposition (ALD) process. In some embodiments, the electron-beam-assisted evaporated $SiO_2$ is about 1-2 nm thick. In some embodiments, the metal gate 30 comprises Ti/Pt/Au, Pt/Au or Al metal gates.

In some embodiments presently disclosed, the $SiO_2$ and $HfO_2$ gate dielectric layer 25 is processed with $CF_4$ plasma process for fluorine incorporation before forming the gate metal 30. In some embodiments, the $CF_4$-based fluorination process is done with $CF_4/O_2$ plasma with a ratio of, for example, 24:3. In some embodiments, the pressure was 90 milli-torr with low RF power of 50 W. In some embodiments, the $CF_4$-based fluorination process is applied for about 5 min.

Figure 2A:
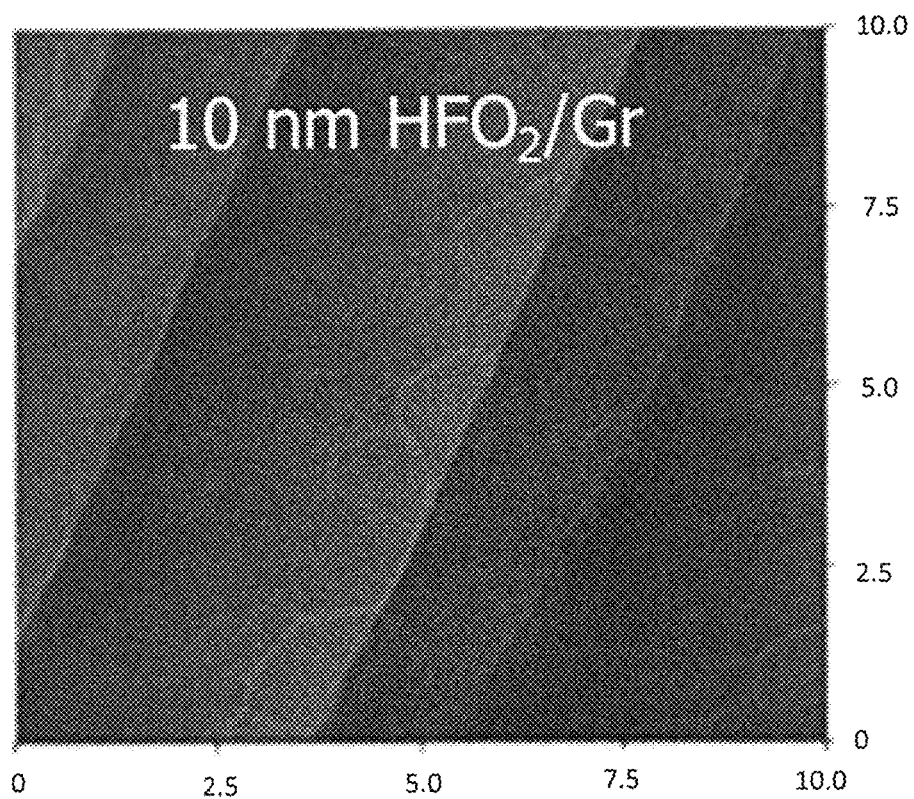
FIG. 2a depicts Atomic Force Microscopy image of $HfO_2$ material according to some embodiments presently disclosed.
Figure 2B:
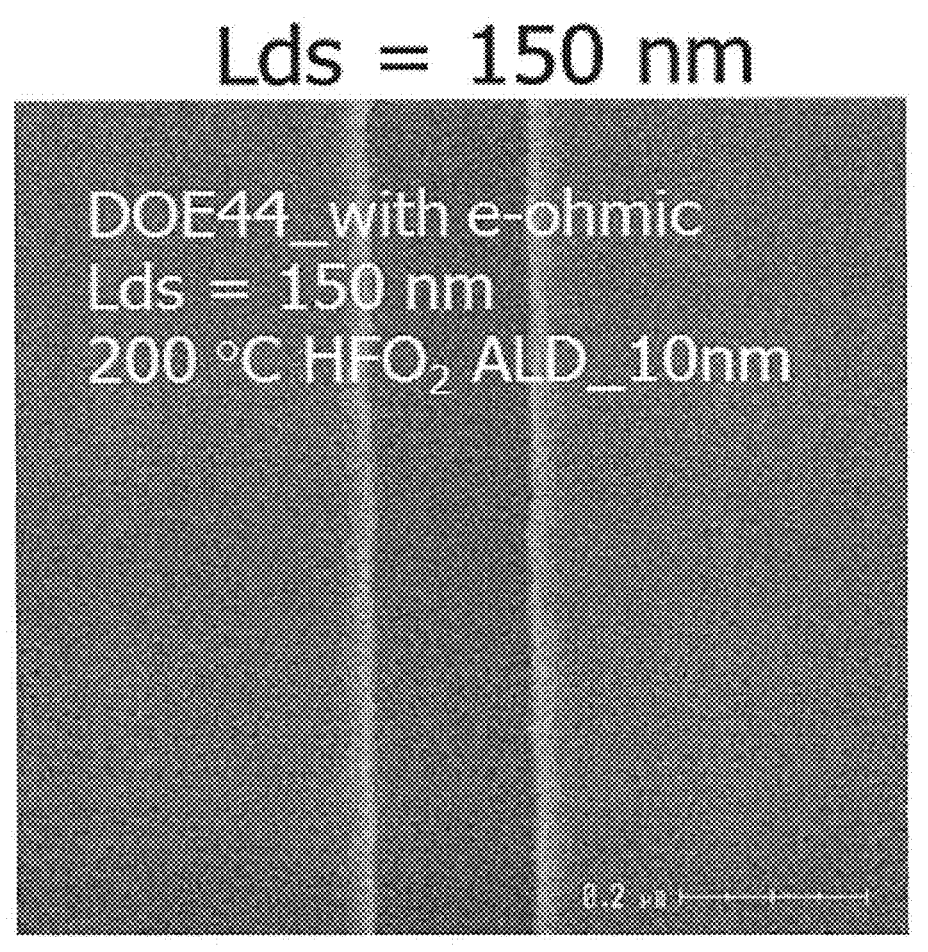

Referring to FIG. 2a, Atomic Force Microscopy image of $HfO_2$ material is shown disposed above a graphene FETs. Referring to FIG. 2b, Scanning Electron Microscope image of $HfO_2$ material is shown disposed above a graphene FETs. Both FIGS. 2a-b show smooth coverage without cracking or pinholes. Without the $SiO_2$ layer beneath the $HFO_2$, the $HFO_2$ may develop line cracks.

Figure 3A:
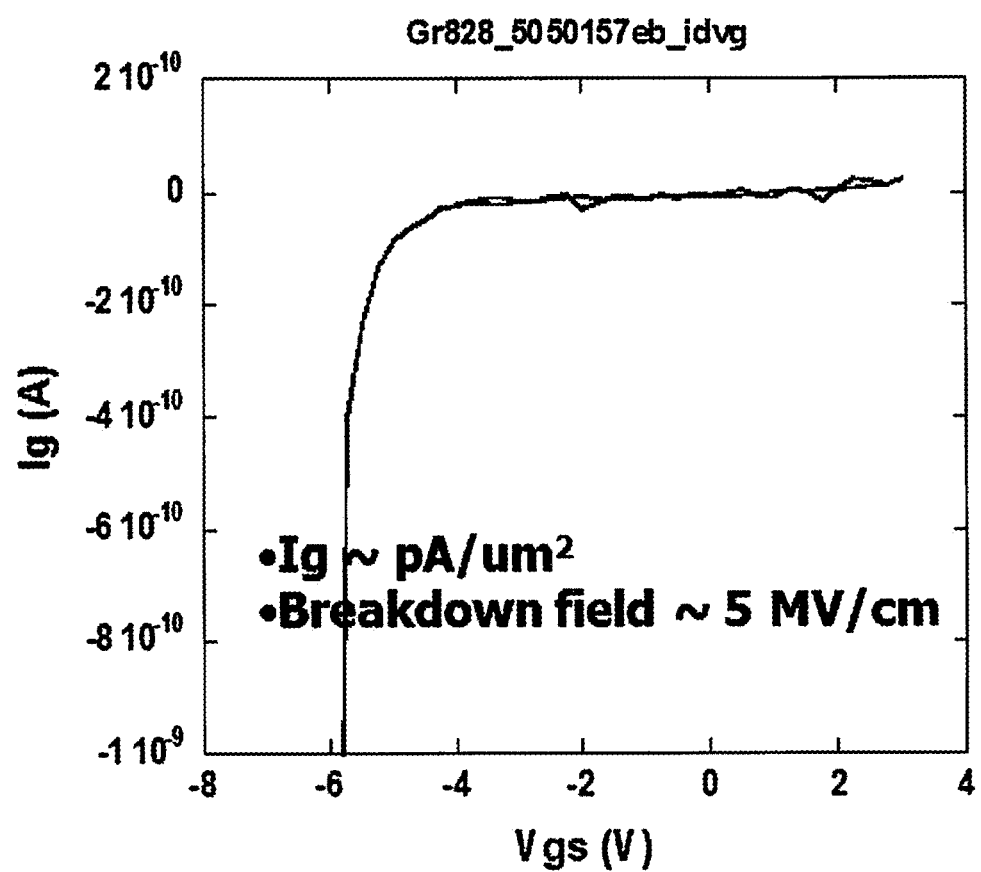
FIG. 3a depicts leakage current of $HfO_2$ material according to some embodiments presently disclosed.
Figure 3B:
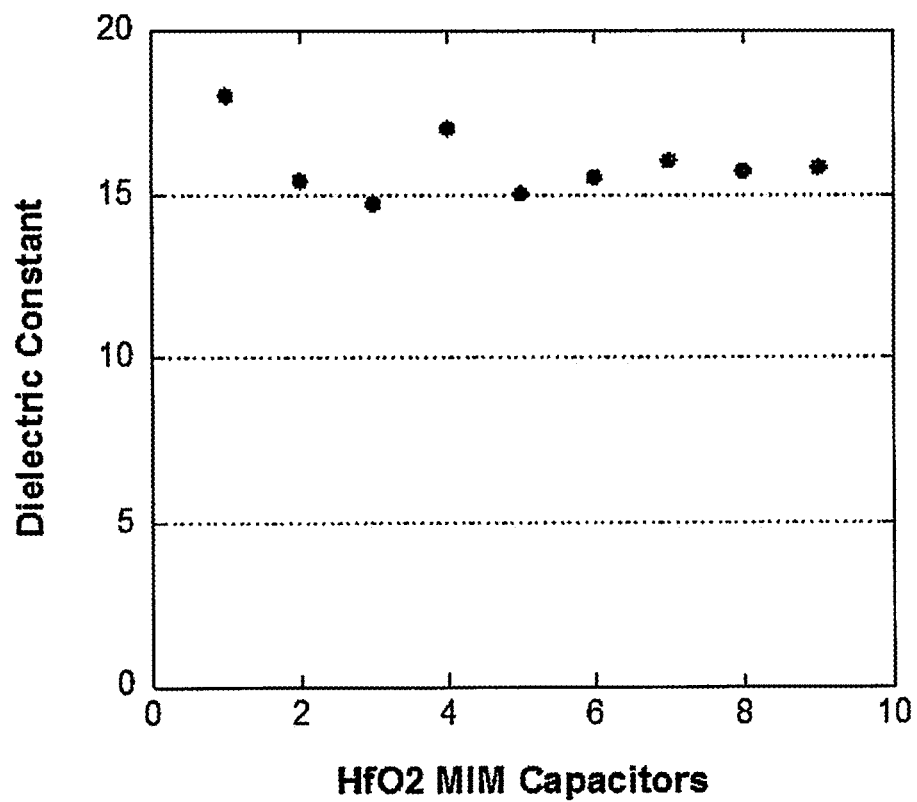
FIG. 3b depicts a dielectric constant of $HfO_2$ material according to some embodiments presently disclosed.

Referring to FIGS. 3a-b, $HfO_2$ dielectric layer 25 has negligible gate leakage current of $\sim pA/um^2$ (shown in FIG. 3a) and a dielectric constant of about 16 (shown in FIG. 3b).

Figure 4A:
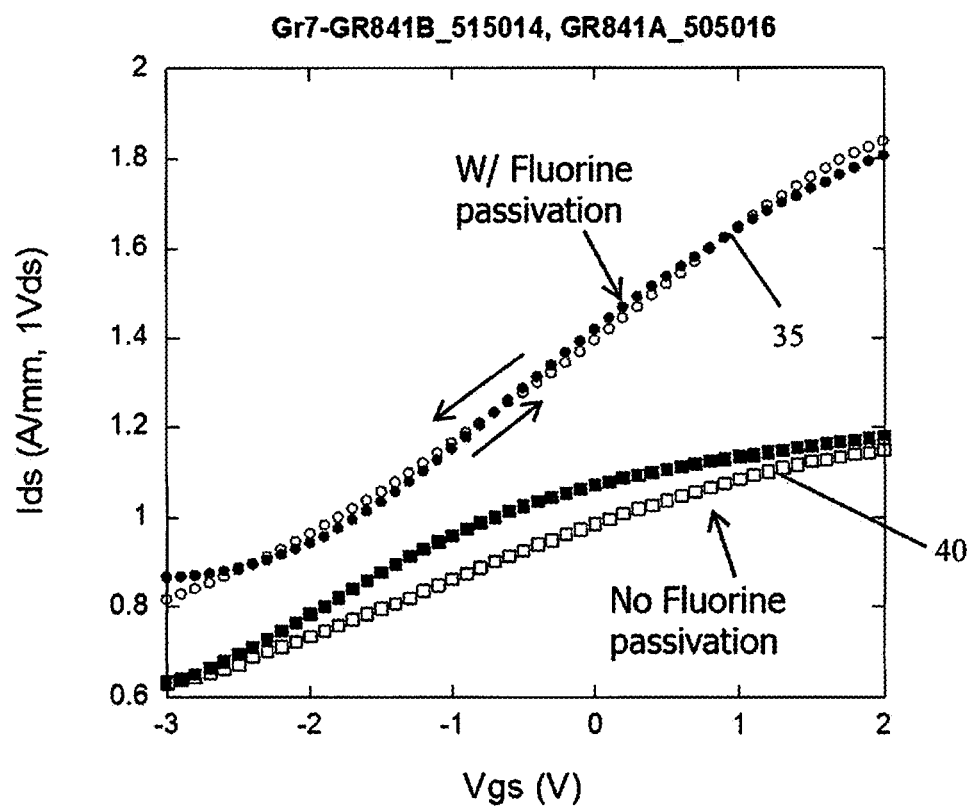
FIG. 4a depicts graphs representing I-V curve of $HfO_2$/Graphene MOSFETs with fluorine passivation and without fluorine passivation according to some embodiments presently disclosed.
Figure 4B:
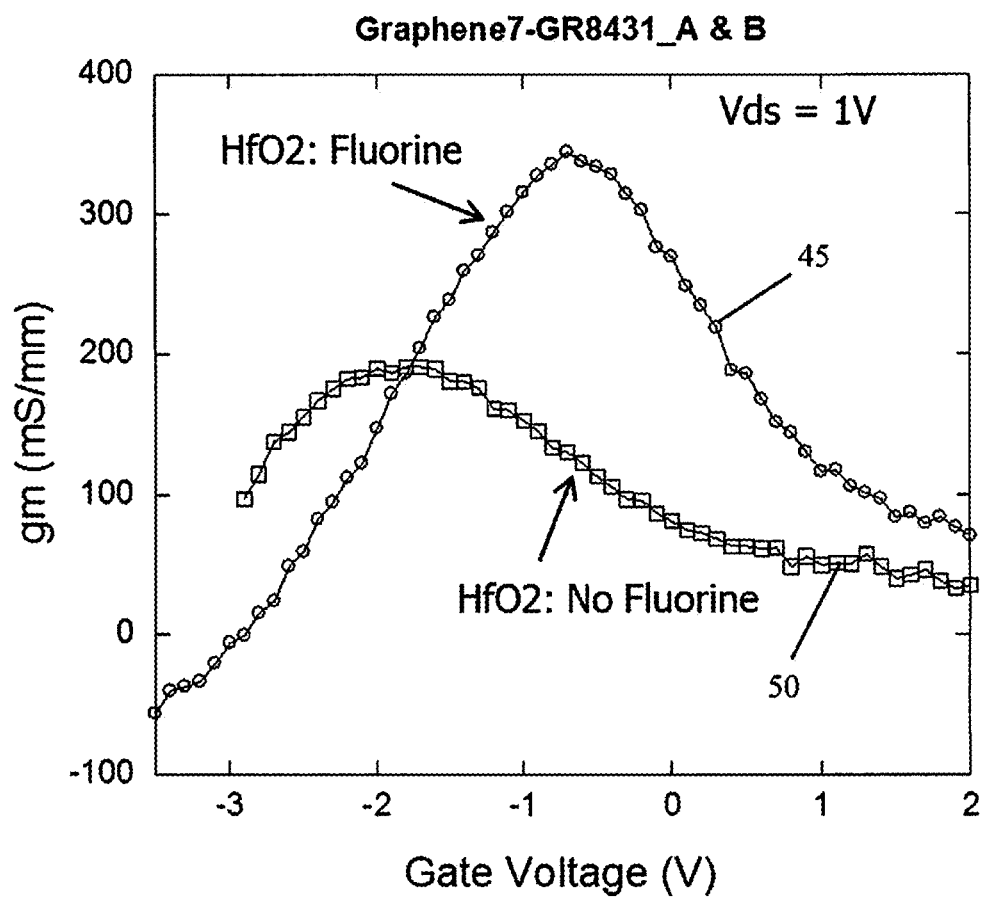
FIG. 4b depicts graphs representing extrinsic gm curve of $HfO_2$/Graphene MOSFETs with fluorine passivation and without fluorine passivation according to some embodiments presently disclosed.

FIG. 4a depicts a graph 35 representing I-V curve of $HfO_2$/Graphene MOSFETs with fluorine passivation and depicts a graph 40 representing I-V curve of $HfO_2$/Graphene MOSFETs without fluorine passivation. FIG. 4b depicts a graph 45 representing extrinsic gm curve of $HfO_2$/Graphene MOSFETs with fluorine passivation and depicts a graph 50 representing extrinsic gm curve of $HfO_2$/Graphene MOSFETs without fluorine passivation. As shown in FIGS. 4a-b, the hysteresis is greatly reduced and on-state current is improved from 1.2 A/mm to 1.8 mA/mm at Vds=1 V. The gm was improved from 200 mS/mm to 350 mS/mm at Vds=1 V.

Figure 5A:
FIGS. 5a-e depict a process for forming a MOSFET according to some embodiments presently disclosed.
Figure 5B:
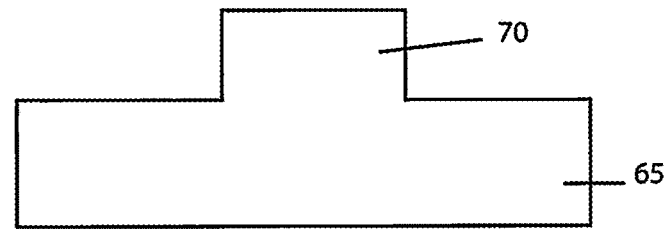
Figure 5C:
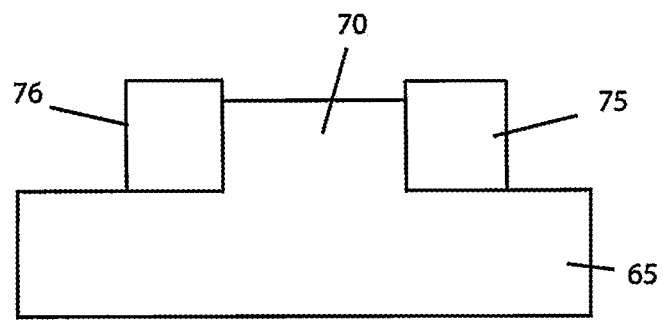
Figure 5D:
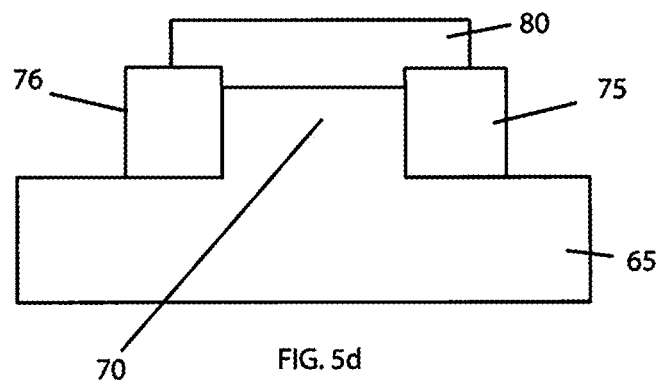
Figure 5E:
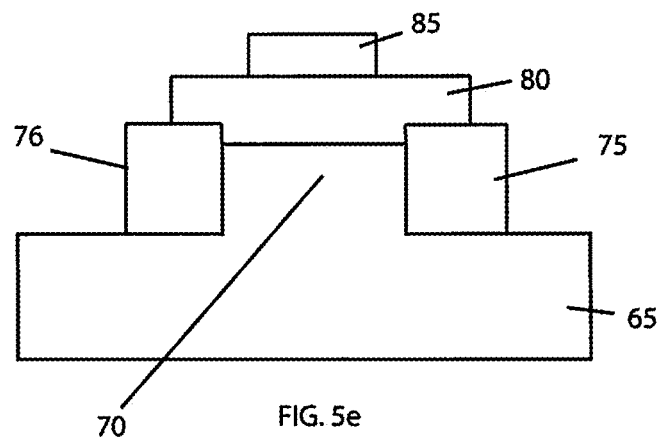

According to some embodiments presently disclosed, a process for forming a MOSFET according to the present disclosure is described with reference to FIGS. 5a-e. Referring to FIG. 5a, a graphene wafer 65 is formed using, for example, chemical vapor deposition or epitaxial deposition methods. Referring to FIG. 5b, a graphene mesa 70 is formed. In some embodiments, a 350° C. 3 minute Rapid Thermal Annealing process is applied to the graphene mesa 70. Referring to FIG. 5c, graphene ohmic contact 75 and/or 76 are formed. In some embodiments, a 350° C. 3 minute Rapid Thermal Annealing process is applied to the graphene ohmic contact 75 and/or 76. Referring to FIG. 5d, a high dielectric constant (K) gate dielectric layer 80 is deposited above the graphene mesa 70. In some embodiments, the high dielectric constant (K) gate dielectric layer 80 is treated with fluorine plasma. Referring to FIG. 5e, gate metal layer 85 is deposited above the gate dielectric layer 80.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. A field-effect transistor comprising:
   a graphene layer;
   a composite gate dielectric layer passivated with fluorine above the graphene layer, wherein the composite gate dielectric layer comprises a $SiO_2$ layer directly on the graphene layer, and a $HfO_2$ layer on the $SiO_2$ layer; and
   a metal gate disposed above the composite gate dielectric layer.

2. The field-effect transistor of claim 1, wherein the $SiO_2$ layer is about 1-2 nm thick.

3. The field-effect transistor of claim 1, further comprising a substrate layer supporting the graphene layer.

4. The field-effect transistor of claim 3, further comprising a source and a drain on the substrate layer.

5. The field-effect transistor of claim 1, wherein the $HfO_2$ layer is in direct contact with the $SiO_2$ layer.

6. A method comprising:
   forming a graphene mesa from a graphene layer on a wafer; and
   forming a composite gate dielectric layer passivated with fluorine above the graphene mesa, wherein the composite gate dielectric layer comprises a $SiO_2$ layer on the graphene mesa, and a $HfO_2$ layer on the $SiO_2$ layer.

7. The method of claim 6, further comprising applying Rapid Thermal Annealing to the graphene mesa.

8. The method of claim 6, further comprising forming one or more ohmic contacts on the wafer.

9. The method of claim 8, further comprising applying Rapid Thermal Annealing to the one or more ohmic contacts.

10. The method of claim 6, wherein the forming of the composite gate dielectric layer comprises applying fluorine plasma to the composite gate dielectric layer to passivate the composite gate dielectric layer with the fluorine.

11. The method of claim 6, further comprising forming a gate metal layer above the composite gate dielectric layer.

12. The method of claim 6, wherein the $SiO_2$ layer is about 1-2 nm thick.

13. The method of claim 6, wherein the forming of the composite gate dielectric layer comprises depositing the $HfO_2$ layer using an Atomic Layer Deposition (ALD) process.

14. The method of claim 6, wherein the forming of the composite gate dielectric layer comprises processing the composite gate dielectric layer with a $CF_4$ plasma process to passivate the composite gate dielectric layer with the fluorine.

15. The method of claim 6, wherein the $HfO_2$ layer is in direct contact with the $SiO_2$ layer.

\* \* \* \* \*